(12) United States Patent
Kluge

(10) Patent No.: US 8,040,676 B2
(45) Date of Patent: Oct. 18, 2011

(54) CARRIER BODY FOR COMPONENTS OR CIRCUITS

(75) Inventor: Claus Peter Kluge, Roslau (DE)

(73) Assignee: CeramTec GmbH, Plochingen (DE)

( * ) Notice: Subject to any disclaimer, the term of this patent is extended or adjusted under 35 U.S.C. 154(b) by 0 days.

(21) Appl. No.: 12/293,151

(22) PCT Filed: Mar. 22, 2007

(86) PCT No.: PCT/EP2007/052726
§ 371 (c)(1),
(2), (4) Date: Sep. 22, 2008

(87) PCT Pub. No.: WO2007/107601
PCT Pub. Date: Sep. 27, 2007

(65) Prior Publication Data
US 2009/0086436 A1    Apr. 2, 2009

(30) Foreign Application Priority Data

Mar. 23, 2006 (DE) .................. 10 2006 013 873
Nov. 24, 2006 (DE) .................. 10 2006 055 965
Dec. 8, 2006 (DE) .................. 10 2006 058 417

(51) Int. Cl.
*H05K 7/20* (2006.01)
(52) U.S. Cl. ......... 361/719; 361/704; 361/707; 257/712
(58) Field of Classification Search .................. 361/688, 361/704, 707, 717–719; 257/706, 707, 712; 165/80.3, 185; 174/16.1, 16.3
See application file for complete search history.

(56) References Cited

U.S. PATENT DOCUMENTS

| | | | | |
|---|---|---|---|---|
| 4,663,215 A * | 5/1987 | Dubuisson et al. | ........... | 428/209 |
| 4,681,656 A * | 7/1987 | Byrum | ............................ | 216/65 |
| 5,366,688 A | 11/1994 | Terpstra et al. | | |
| 5,649,593 A | 7/1997 | Yamaguchi et al. | | |
| 5,708,566 A * | 1/1998 | Hunninghaus et al. | ........ | 361/704 |
| 5,736,786 A * | 4/1998 | Sankaran et al. | ............. | 257/717 |
| 5,798,566 A * | 8/1998 | Sato et al. | ..................... | 257/712 |
| 6,175,084 B1 * | 1/2001 | Saitoh et al. | .................. | 174/252 |
| 6,373,705 B1 * | 4/2002 | Koelle et al. | .................. | 361/720 |
| 6,529,380 B1 * | 3/2003 | Kono | ............................. | 361/708 |
| 6,812,559 B2 * | 11/2004 | Palm et al. | ..................... | 257/691 |
| 6,909,185 B1 * | 6/2005 | Kondo et al. | ................. | 257/746 |
| 6,912,130 B2 * | 6/2005 | Osanai et al. | ................. | 361/699 |
| 6,936,855 B1 * | 8/2005 | Harrah | ........................... | 257/88 |

(Continued)

FOREIGN PATENT DOCUMENTS

DE    37 09 200 A1    9/1988

OTHER PUBLICATIONS

"Monolithic Ceramic Substrate and Heat Sink for Integrated Circuit Packages" IBM Technical Disc. Bulletin (Apr. 1989).

*Primary Examiner* — Boris Chervinsky
(74) *Attorney, Agent, or Firm* — Fulbright & Jaworski L.L.P.

(57) ABSTRACT

A carrier body for electrical or electronic component elements or circuits, the carrier body being electrically nonconductive or virtually nonconductive. In order to simplify the carrier body while at the same time providing extremely improved heat dissipation, the invention process that the carrier body is provided integrally with heat-dissipating or heat-supplying cooling elements.

14 Claims, 12 Drawing Sheets

U.S. PATENT DOCUMENTS

| | | | |
|---|---|---|---|
| 6,984,888 B2 * | 1/2006 | Sung | 257/720 |
| 6,992,887 B2 * | 1/2006 | Jairazbhoy et al. | 361/689 |
| 7,019,975 B2 * | 3/2006 | Nagatomo et al. | 361/704 |
| 7,034,345 B2 * | 4/2006 | Chang et al. | 257/177 |
| 7,067,903 B2 * | 6/2006 | Tachibana et al. | 257/625 |
| 7,083,759 B2 * | 8/2006 | Osada et al. | 419/23 |
| 7,143,929 B2 * | 12/2006 | Furukuwa | 228/246 |
| 7,186,461 B2 * | 3/2007 | Rita | 428/426 |
| 7,206,205 B2 * | 4/2007 | Obu et al. | 361/704 |
| 7,244,965 B2 * | 7/2007 | Andrews et al. | 257/98 |
| 7,256,353 B2 * | 8/2007 | Osanai et al. | 174/252 |
| 7,269,017 B2 * | 9/2007 | Berlin et al. | 361/719 |
| 7,355,853 B2 * | 4/2008 | Emoto et al. | 361/704 |
| 7,521,789 B1 * | 4/2009 | Rinehart et al. | 257/699 |
| 7,532,481 B2 * | 5/2009 | Nagase et al. | 361/739 |
| 2003/0038393 A1 | 2/2003 | Panek et al. | |
| 2005/0019534 A1 * | 1/2005 | Roethlingshoefer et al. | 428/209 |
| 2005/0083655 A1 * | 4/2005 | Jairazbhoy et al. | 361/699 |

* cited by examiner

Fig. 5
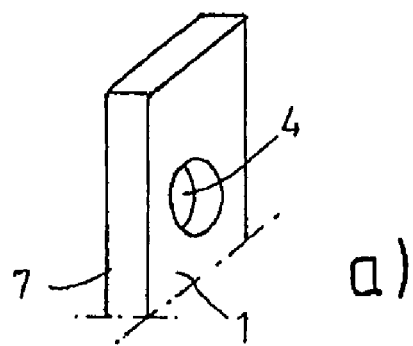
a)
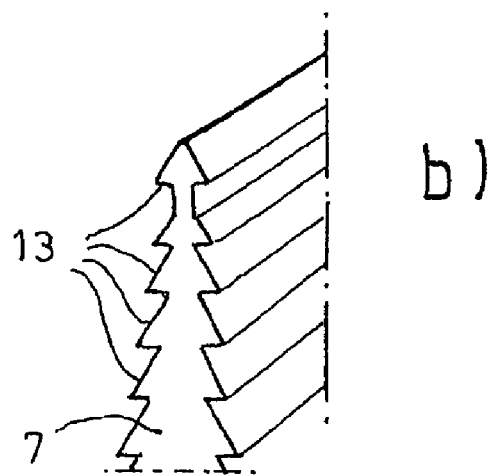
b)
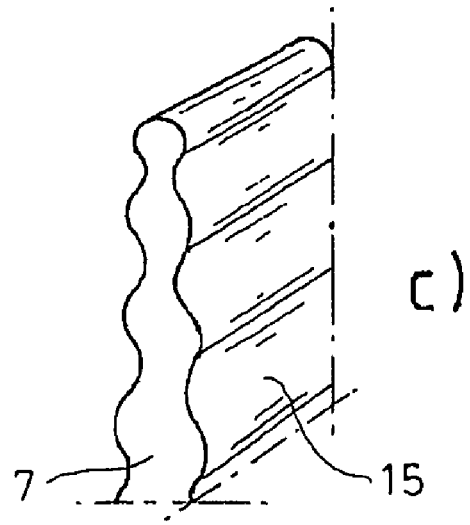
c)
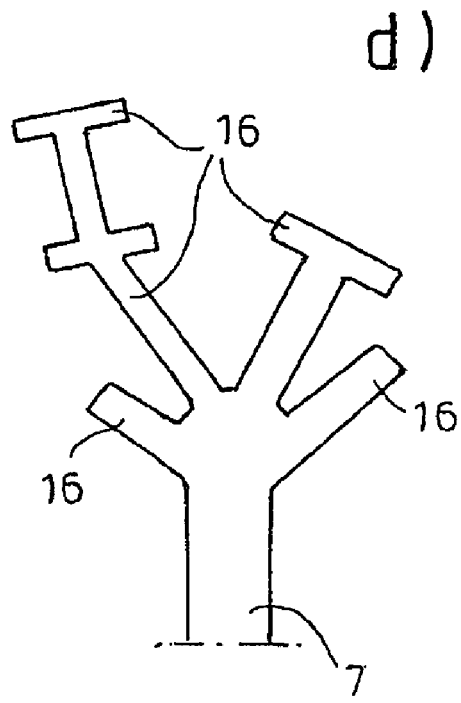
d)

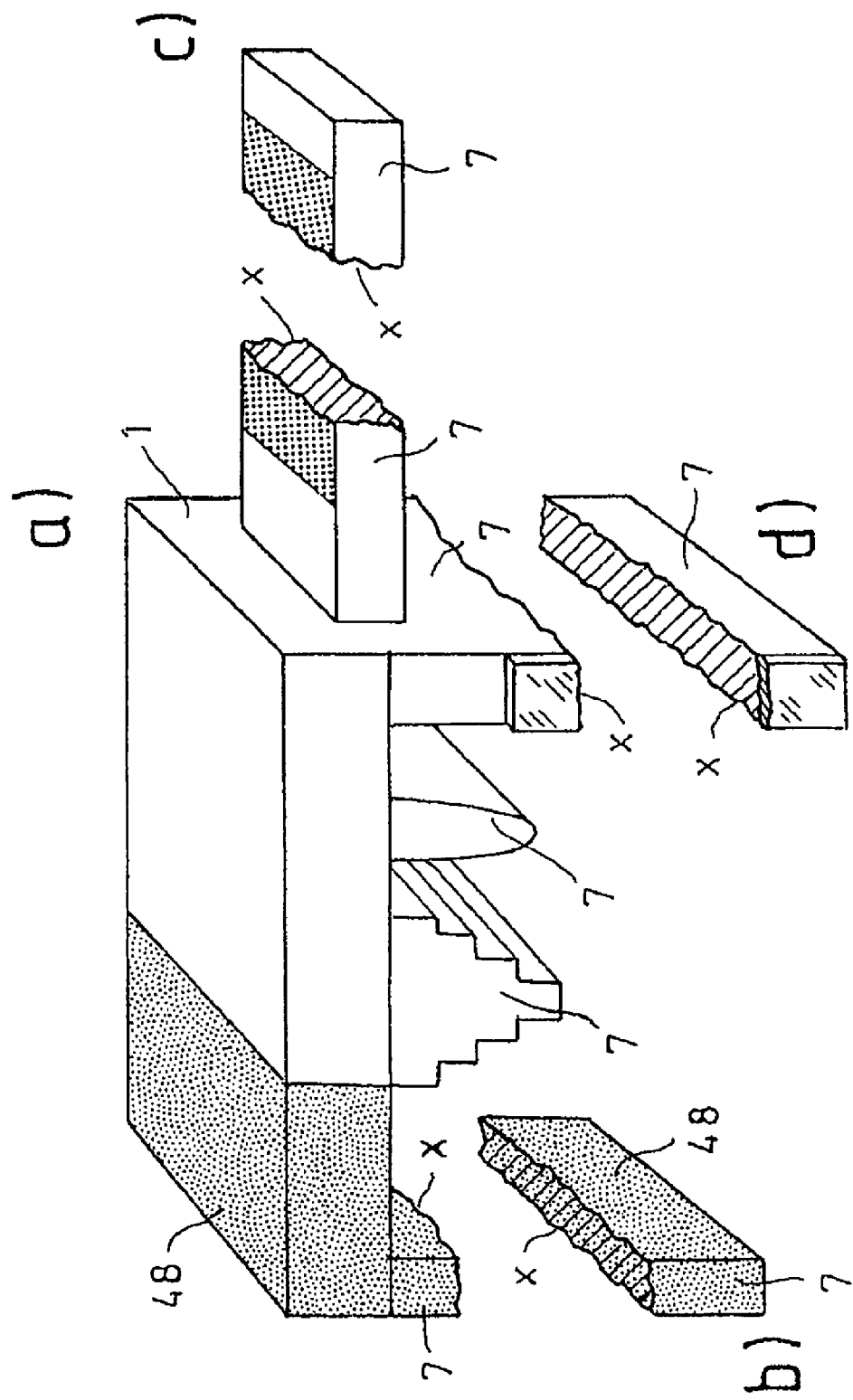

Fig.19
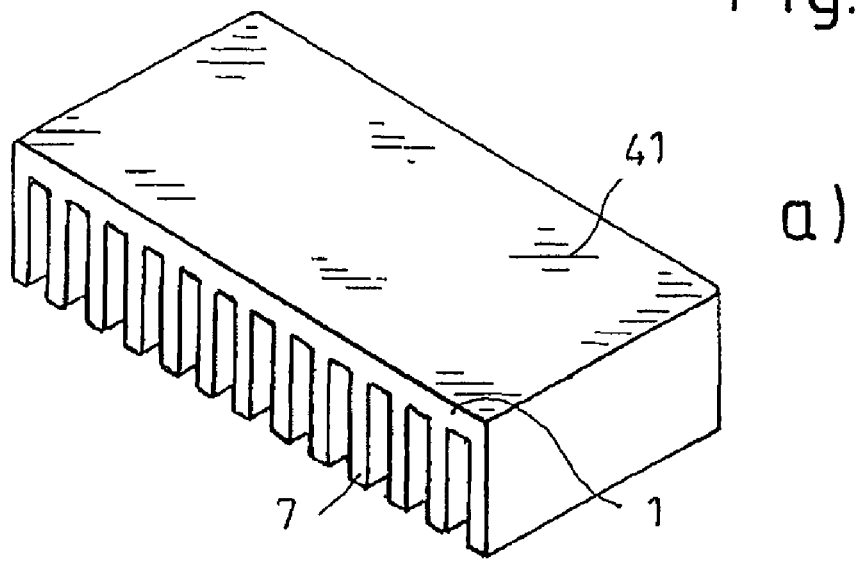
a)
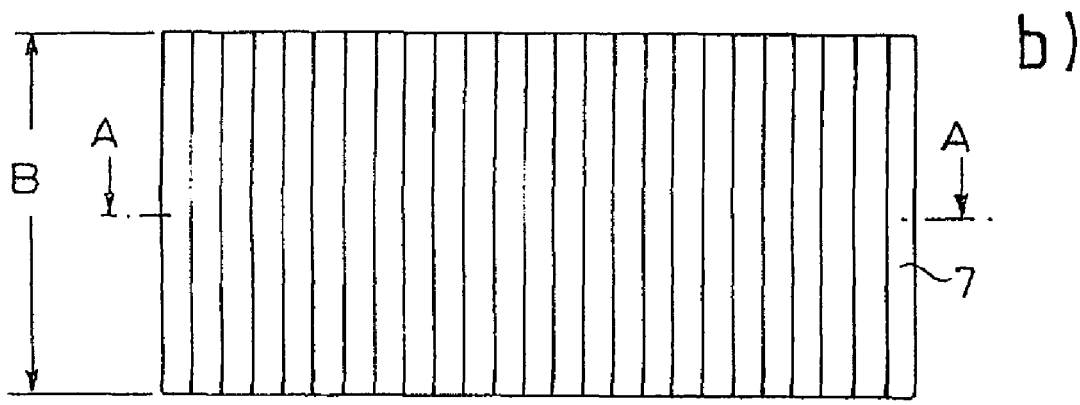
b)
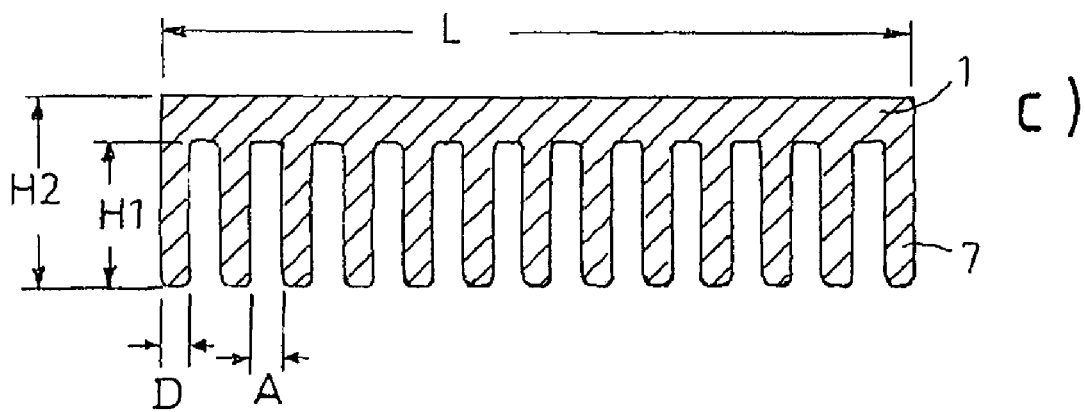
c)

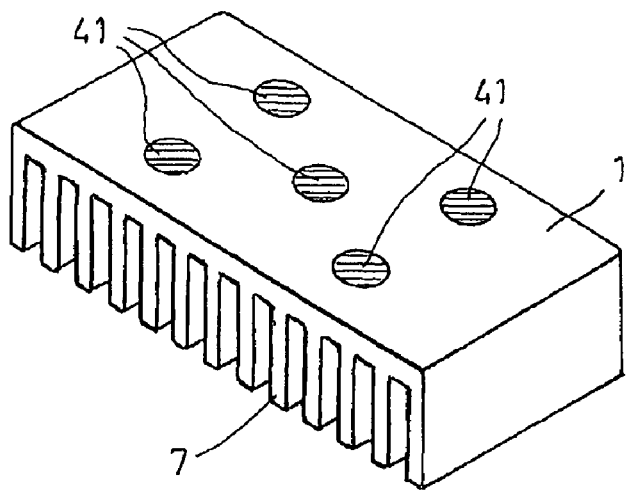
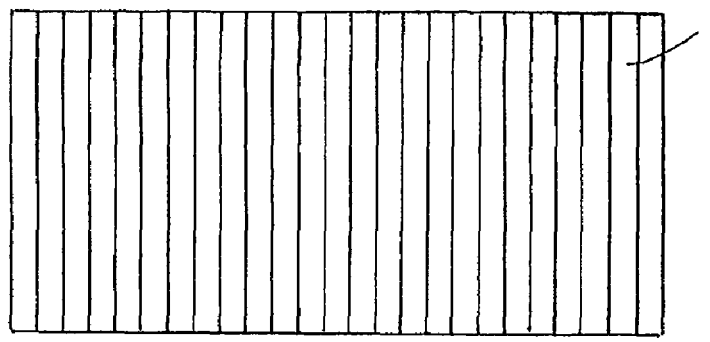
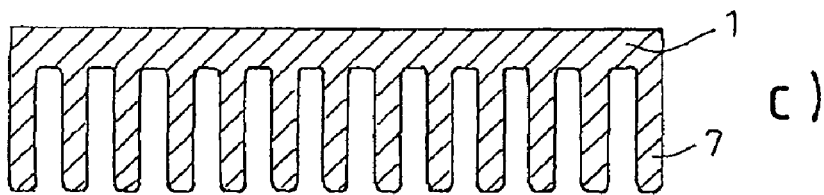
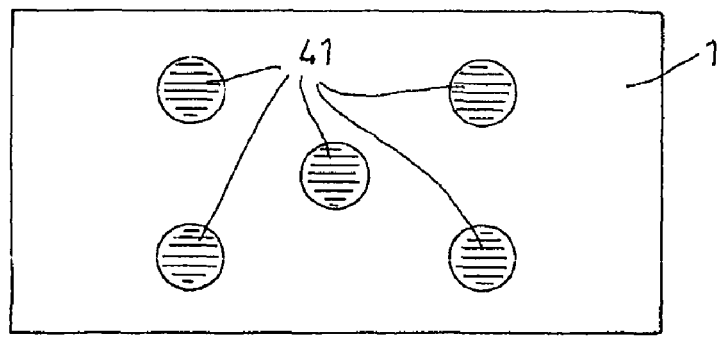
Fig. 20

CARRIER BODY FOR COMPONENTS OR CIRCUITS

This application is a §371 of PCT/EP2007/052726 filed Mar. 22, 2007 which claims priority from DE 10 2006 013 873.2 filed Mar. 23, 2006, DE 10 2006 055 965.7 filed Nov. 24, 2006 and DE 10 2006 058 417.1 filed Dec. 8, 2006.

FIELD OF THE INVENTION

The invention relates to a carrier body for electrical or electronic component elements or circuits, the carrier body being electrically nonconductive or virtually nonconductive.

BACKGROUND AND SUMMARY OF THE INVENTION

According to the prior art, planar structures are constructed for dissipating heat from modules of power electronics, which structures dissipate the heat diffusing from a heat source (active or passive electrical components) via numerous interlayers (solders, conductive pastes, adhesive compounds, metallizations) into an electrically nonconductive, uniformly shaped, simple geometric body (disc, rectangular substrate). Although the geometry of the individual components is simple, the entire layer construction is complicated and requires consecutive application of a very wide variety of processes which are susceptible to faults, such as adhesive bonding, pressing, screwing and also, to a limited extent, soldering. Each interface of this stacked construction represents a barrier for heat transfer and reduces either the reliability and/or the life of the module (oxidation, breakdown, ageing) or limits its performance.

Organic and ceramic circuit carriers (carrier bodies) having low or insufficient thermal conductivity need to be attached in a permanently interlocking manner to a metallic cooling body by additional measures, such as electrically insulating interlayers. As the thermal loads increase, some of the heat sources need to be removed from the printed circuit board and mounted, in the conventional sense, on a metallic cooling body and electrically connected to the circuit carrier.

The construction comprising a plurality of different materials is complex and a compromise in terms of long-term reliability. An increase in the power density is only possible to a small extent.

The thermal conductivity can only be used to a certain extent since a planar-parallel construction is involved.

A direct combination of an electrically conductive cooling body and a heat source is likewise not possible.

In order to simplify the carrier body whilst at the same time providing extremely improved heat dissipation, the invention proposes that the carrier body is provided integrally with heat-dissipating or heat-supplying cooling elements.

BRIEF DESCRIPTION OF THE FIGURES

FIGS. 5a-5d show different possibilities as to how surface modifications may appear.

FIG. 5b shows a surface modification by introducing angular furrows 13 and/or a simultaneous thickness profile for the cooling element.

FIG. 5c shows a surface modification by introducing corrugated furrows 15 into the cooling elements.

FIG. 5d shows a surface modification by branch-like bifurcations in the cooling element.

FIG. 15a shows a carrier body with cooling elements, wherein the carrier body may have been completely penetrated by color FIG. 15b shows a detail of the carrier body or cooling element 7 along a broken edge x, wherein a uniform penetration of color can be seen.

FIG. 15c shows a coloration which has the form of a gradient.

FIG. 15d shows a detail of the cooling body in which the bulk material has not been colored.

FIG. 19a shows the carrier body with the cooling elements in a three-dimensional view. FIG. 19b shows a plan view, from below, of the cooling elements 7 in FIG. 19a.

FIG. 19c shows a cross-section along the line A-A in FIG. 19b.

FIGS. 20a, b, c, d show a carrier body 1 with cooling elements 7, which is identical in terms of its dimensions to the carrier body 1 in FIG. 19, wherein the entire surface of the carrier body is not in the form of a sintered metallization region, but wherein only individual circular metallization regions are arranged which consist of tungsten and are chemically nickel-plated.

DETAILED DESCRIPTION

Figure 1:
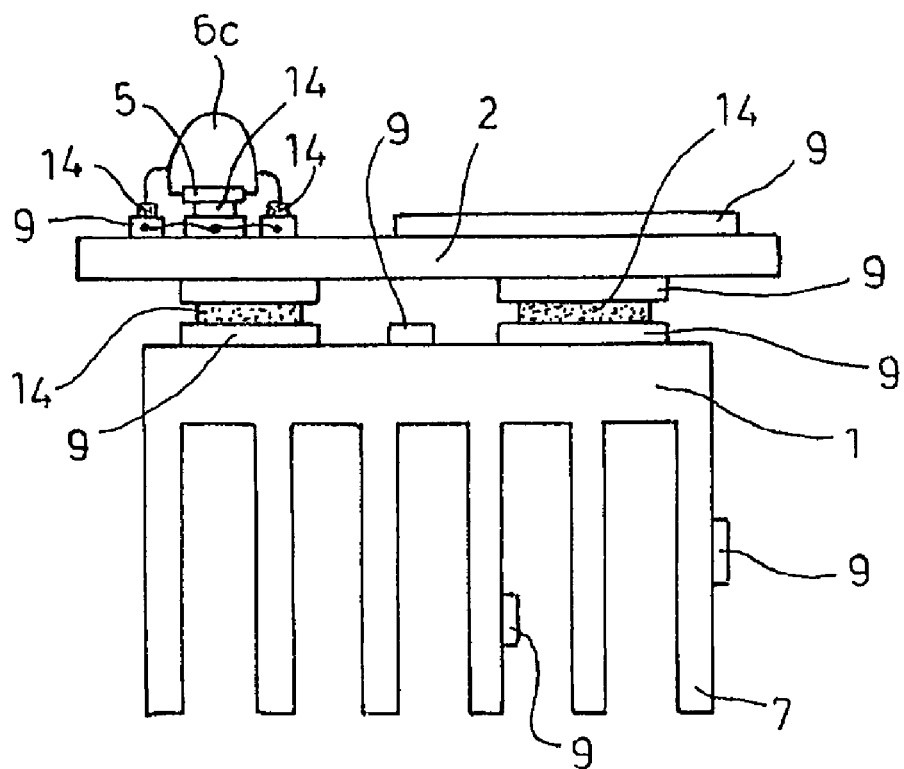
FIG. 1 shows an embodiment if the carrier body according to the invention made of a ceramic head with cooling elements of ceramic which are formed integrally as ribs, having a further independent carrier body.

In one configuration according to the invention, the carrier body is a printed circuit board. The conductor tracks are then applied to the carrier body. The conductor tracks of the printed circuit board can be intimately connected to the carrier body, for example via a thermal process, or metallic conductor tracks can be adhesively bonded thereon or conductive adhesives can be used. It is also possible for combinations of different conductor track types to be used.

Preferably, the components have a direct outflow of heat into the carrier body or else into the cooling elements. The components can be connected to the carrier body, for example directly or via one or more layers.

The terms component elements and components describe the same objects.

Preferably, the cooling elements are drilled holes, channels, ribs and/or cutouts, to which a cooling medium can be applied.

The heating or cooling medium can be a gas, such as air, for example, or a liquid, such as water or oil, for example.

In a preferred configuration, the carrier body comprises at least one ceramic component or a composite of different ceramics. The ceramic components may be present in the crystallographic sense in monocrystalline or polycrystalline form or in combinations thereof.

Ceramic components or ceramics may be, for example, aluminium oxide, technical aluminium oxides, zirconium oxide, differently doped zirconium oxides, aluminium nitride, silicon nitride, silicon oxide, glass ceramic, LTCC (Low Temperature Co-fired Ceramics), silicon carbide, boron nitride, boron oxide.

Of particular technical significance are technical 96%-strength aluminium oxide with thermal conductivities of approximately 24 W/mK, and technical >99%-strength aluminium oxide with approximately 28 W/mK, technical or pure aluminium nitrides with, for example, approximately 180 W/mK, aluminium oxides reinforced with zirconium oxide with approximately 24 W/mK, and glass ceramics with approximately 2 W/mK.

High thermal conductivities are of particular technical significance in applications such as power electronics, high-power LEDs, slow-response high-load fuses, power resistors. Low thermal conductivities are of particular technical significance in rapid-response high-load resistors and in applications in which it is necessary to ensure a temperature distribution over a surface (the carrier body) which is as uniform as possible. Here, thermoanalytical measurement fittings could be mentioned, for example.

Expediently, the cooling elements are sintered with the carrier body, as a result of which the production is simplified and, in many cases, the durability of the entire construction is thus also improved.

In one particular configuration, the carrier body comprises a composite material, and the composite material contains electrically nonconductive or virtually nonconductive matrix materials with heat-conducting aggregates.

Resins, polymers or silicones are preferably used as the matrix materials.

In a preferred configuration, the composite materials are multicomponent systems comprising polymers or silicones mixed with ceramic components, such as, for example:
a) polymers with $Al_2O_3$
b) polymers with AlN
c) silicones with $Al_2O_3$/AlN
d) silicones and polymers with $ZrO_2/Y_2O_3$.

The carrier body and/or the cooling element can also be a composite comprising metal and/or ceramic or a composite of ceramic and metal.

In one embodiment, the carrier body and/or the cooling element is multilayered.

Expediently, the component elements are electrically conductively and/or thermally conductively connected to the carrier body. Component elements may be, for example, electrical or electronic or active or passive or geometric bodies or any desired combinations thereof.

In one development of the invention, at least one mounting option is connected to the carrier body or cooling element.

Via the mounting option, the carrier body can be connected to further carrier bodies with or without electrical or electronic component elements or circuits. The fixing can take place via screwing, riveting, clamping, adhesive bonding, crimping, welding, soldering or further fixing options.

The carrier body can take on the function of the cooling body, and vice versa.

The cooling elements, with identical or any desired sizes and/or with identical or different physical alignments, are preferably integrally connected to the carrier body.

The cooling elements can bear or have any desired surface structurings, which result in the effect of altering the surface.

Advantageously, one or more surface structurings or their combinations are arranged on one or more cooling elements, for example wrinkling, furrows, corrugations, apertures in the surface or dendritic or branching structures.

Preferably, the surface structurings are, for example, planar or uneven or rough surfaces of carrier bodies or cooling elements, which are connected, in particular in an interlocking manner and/or permanently and/or temporarily or as a combination thereof, to likewise uneven or planar or rough surfaces of components to be mounted. The type of connection may be, for example, soldering or adhesive bonding.

In a special embodiment, the carrier body or the cooling elements has or have an interlocking connection with component elements which covers the entire area or part of the area. The composite can be present, for example, permanently or temporarily or as a combination thereof. Component elements may be, for example, electrical or electronic or active or passive or geometric bodies or any desired combinations thereof.

In one configuration, the carrier body or the cooling elements is or are flat or is or are provided with cutouts or with elevations, these cutouts or elevations preferably being formed integrally with the carrier body or the cooling elements.

Furthermore, the carrier body can preferably be connected to metal layers >5 µm, which are applied, for example, using DCB (Direct Copper Bonding) processes or AMB (Active Metal Brazing) processes.

The construction according to the invention with components is present, for example, in the rest state at room temperature. During operation, local temperature maxima may now arise in a very short period of time at the components as a result of their operation. So-called thermal shock results in the environment of the component. The construction according to the invention can withstand this state without any intrinsic damage. If these states occur alternately, so-called thermocycling, in the case of conventional fittings with, for example, adhesively bonded conductor tracks, after relatively few cycles detachment phenomena of conductor tracks on the carrier body result, for example. The construction according to the invention displays a considerably improved resistance to thermocycling in comparison with conventional fittings.

In one development of the invention, identical or different component elements with identical or different physical alignments are fixed on the carrier body. The alignment can take place, for example, by means of different amounts of solder or different cutouts or elevations or any desired combinations of alignment options. In the case of LEDs, for example, their alignment and therefore the light can thus be aligned in a simple manner.

Advantageously, the carrier body according to the invention or the cooling element can be used as a mounting body.

In one configuration of the invention, sensory components are connected to the carrier body. Sensory components can emit, for example, signals from which variables such as pressure, temperature, weight, etc. can be derived.

In one configuration of the invention, sensory signals are derived from the partial or total deformation of the carrier body.

Preferably, the carrier body is partially provided with metallic regions. These regions can connect the upper and lower sides of the carrier body electrically to one another, for example.

Preferably, the carrier body builds up virtually no electrochemical potential with respect to other materials. Given corresponding coupling, for example, the corrosion of the carrier body or of the environment can therefore be significantly reduced.

In one inventive configuration, the carrier body is used as a heat source by the heat produced being given up to the medium whose temperature is to be regulated via the carrier body or the cooling element.

Preferably, the carrier body has a targeted temperature distribution owing to supplied heat or cold, which is transferred to the carrier body or is supplied via the cooling elements. For example, temperature differences in the environment can thus be compensated for in a targeted manner.

Preferably, substances are applied to the carrier body which make bonding processes possible. By way of example, a metallization construction W—Ni—Au (tungsten-nickel-gold) can be used here in order to make gold-wire bonding possible. The substances may consist of one or more materials, which are applied to the carrier body mixed or from at least one layer. The substances may comprise, for example, materials such as gold or layers comprising a plurality of materials such as copper, nickel and gold or comprising mixtures of at least two different materials, such as metals and/or aggregates, for example, and layers of identical or different metals or aggregates.

In a development of the invention, one or more light-emitting substances or one or more light-emitting components or combinations thereof are connected to the carrier body. For example, this may be a semiconductor or a housing with a semiconductor, such as is used for LED lighting systems.

Preferred are metals or metal layers which are connected over the entire area or over part of the area to the carrier body intimately or by a mechanical interlocking connection and have an identical or different thermal conductivity to the carrier body. Metals or metal layers may be, for example, pure-grade or technical-grade tungsten, silver, gold, copper, platinum, palladium, nickel or mixtures of at least two different metals. Metals or metal layers can also be mixed, for example, with bonding agents or other aggregates such as glasses or polymeric materials. Metals or metal layers may also be, for example, reaction solders, soft solders or hard solders.

It should be stressed in particular that, in the case of punctiform heat sources, the heat needs to be spread, i.e. distributed, very rapidly over the entire surface of the carrier body. A carrier body, with comparatively low thermal conductivity, can thus receive the heat produced, via the metal, distributed over its entire surface. The heat can thus be conducted away onto the cooling elements. Since the carrier body is electrically insulating, the metal can at the same time fulfil the function of electrical conductivity and thermal conductivity.

In a configuration according to the invention, the metals or the metal layers on the carrier bodies may have different functions. For example, they can have the function of electrical conductivity and/or of thermal conductivity or the function of a colour change to the surface or thermal spreading or a bonding agent to third materials, such as, for example, solders, adhesives, and any desired combinations of the functions of identical or different metal regions.

The advantage consists in the matched current-carrying capacity of the metal regions. The metal regions therefore need not necessarily have the same heights or thicknesses, for example.

Consequently, the metals are preferably connected to the carrier body over the entire area or over part of the area with identical or different thicknesses (heights) in identical or different metal regions.

In another configuration according to the invention, identical or different metals are connected to the carrier body over the entire area or over part of the area, with one or more layers with identical or different thicknesses (heights).

In a further configuration, the carrier body has the intrinsic colouring of the material(s) used over the entire area or over part of the area or subregions of the carrier body are coloured differently from the intrinsic colouring. The imparting of colour can arise in different ways and in a combination of these different ways:

Based on a technical aluminium oxide, the carrier body can be provided, for example during the production process thereof, with colour-imparting additives, with the result that the bulk material is completely and mechanically inseparably penetrated by colour as a result of a thermal treatment.

For example, based on a technical zirconium oxide, the carrier body can be provided, after the production process thereof, for example over the surface with colour-imparting additives, with the result that the surface of the bulk material is completely penetrated by colour as a result of a thermal treatment. Depending on the depth of penetration of the resulting coloration, the bulk material can also retain its intrinsic colouring internally. The gradient of the coloration can assume a very wide variety of characteristics.

For example, based on a technical aluminium nitride, the carrier body can be provided with colour-imparting layers, with the result that the bulk material of the carrier body is not coloured and the change in colour is only produced by one or more mechanically separable layers. Colour-imparting layers may be, for example, varnishes, scumbles, adhesive films, metals etc.

In another configuration, the carrier body is connected to at least one further geometrically identical or different carrier body via suitable connecting materials to form a type of three-dimensional array.

Connecting materials may have a single-layered or multi-layered nature. Connecting materials may be identical or different in nature or else be used in combination with a single-layered or multilayered construction. By way of example, connecting materials such as adhesives, metallizations, metals, metals which have been connected to the carrier body, by way of example, by processes such as DCB (Direct Copper Bonding) or AMB (Active Metal Brazing) can be mentioned. It is also possible, for example, to use solders, reaction solders, double-sided adhesive films, etc.

In one embodiment, the carrier body is connected to one or more light-emitting substances or one or more light-emitting components and combinations thereof and, at the same time, is provided with standardized or nonstandardized electrical connectors. It is also possible for combinations of identical or different electrical connectors to be used. A mechanical connection to the carrier body which is appropriate for the electrical connector is preferably used. Electrical connectors may be, for example, lamp bases E27, E14, GU series, G series, U series, R series, plug-in bases, bayonet-type bases, clamping connectors, screw connectors, plug-in connectors, etc. Mechanical connections or combinations of mechanical connections may be, for example, adhesive bonding, soldering, pinch-sealing, riveting, clamping, etc.

In a further configuration, at least one carrier body is connected to at least one further geometrical body via suitable connecting materials to form a type of three-dimensional construction. Connecting materials may have a single-layered or multilayered nature. Connecting materials may be identical or different or can also be used in combination with a single-layered or multilayered construction. At least one or more identical or different carrier bodies can be applied at any desired points with identical or different orientations. By way of example, connecting materials, such as adhesives, metallizations, metals, metals which, by way of example, have been connected to the carrier body using methods such as DCB (Direct Copper Bonding) or AMB (Active Metal Brazing), solders, reaction solders, double-sided adhesive films, etc. could be mentioned. By way of example, geometric bodies may be plates on which at least one or more identical or different carrier bodies are located in different regions.

The carrier body may be, for example, part of a plastic housing.

In another configuration, at least one and/or different or identical carrier bodies are embedded in a matrix material with any desired orientation or oriented in the same direction. The embedding can take place, for example, by injection moulding or diecasting. The embedding compositions themselves should be selected as desired and according to the respective intended functions. Plastics are particularly suitable.

According to the invention, in a carrier body a change in the heat transport can be achieved by modifying the size or the colouring or the size or distribution of the metallized regions or the geometry or the configuration of the cooling elements or the number of cooling elements or combinations thereof. If, for example, the design of the cooling elements is changed, in the case of a constant input of heat, the absolute temperature in the steady state or in the state of equilibrium can change via thermal energy being emitted or absorbed. This can also take place, for example, by cooling elements being added or removed or increased or decreased in size in a targeted manner. The change can also take place, for example, by a change in the colour. Thus the emission characteristics of a black body are different from those of a white body.

In a preferred configuration, the surfaces of the carrier body and the surfaces of the cooling element are at a ratio of 1:x, where $x \geq 1.1$. Of particular technical significance is $x \geq 1.8$, since, as a result, the quantity of heat which can be transported is greater.

Preferably, sintered metallization regions are applied to the surface of the carrier body.

In a configuration according to the invention, the metallization regions consist of tungsten and are chemically nickel-plated. The metallization regions are circular in one configuration.

In a special configuration, the carrier body is provided with electrical conductor tracks, via which electrical voltages up to in the kV range can be transported without electrical voltage flowing away via the bulk material of the carrier body. Of particular technical interest are electrical voltage ranges of from 80 volts to 600 volts, and voltages >>2 kvolts (2000 volts).

In a preferred embodiment, the carrier body does not have any screening effect or has little screening effect with respect to electrical or magnetic or electromagnetic fields or combinations of these, and therefore these fields can also pass through the carrier body.

In one configuration, the carrier body is provided in a targeted manner with materials over the entire area or over part of the area, the function of these materials being to provide regions in which a different screening effect with respect to electrical or magnetic or electromagnetic fields or combinations thereof occurs in comparison with the screening effect of the material of the carrier body.

Preferably, by applying suitable materials, such as metals, for example, in a targeted manner to the carrier body, regions are arranged which owing to their geometry via inductive or capacitive effects or combinations thereof are capable of receiving or transmitting electrical or magnetic or electromagnetic signals. Signals in the broadest sense are used for the wireless transmission of energy. The energy can also transmit additional information items, for example by means of modulation.

In a configuration according to the invention, the carrier body is equipped with the functionality of intelligent self-identification. Self-identification may be, for example, text or a label or a magnetic strip with corresponding information or an RFID unit or combinations thereof.

In one exemplary embodiment, the carrier body consists of technical aluminium oxide with a minimum aluminium oxide content of 89%. The metallization regions are suitable for being capable of soldering on modules, for example, and therefore for producing an intimate connection. The connection with, for example, a conventional LED can be produced via a soldered joint. The soldered joint has at least the functions of the mechanical connection between the LED and the carrier body. In addition, the metallization regions make it possible to make electrical contact with the LED and to make thermal contact.

Using the example of a construction of a carrier body with printed-on and sintered metallization regions (also conductor-track cross-sections) with a soldered-on point heat source, for example an LED, the technically necessary electrical conductor-track cross-section can be selected to be significantly larger than is necessary since, at the same time as the electrical conduction via the metallization regions and the conductor-track cross-sections, the heat is also spread over a larger surface of the carrier body and is therefore distributed over the cooling elements. In comparison with an electrically expedient and sufficiently small metallization region and conductor-track cross-section, a greater quantity of heat can be distributed in a shorter period of time over the surface of the carrier body and from there over the cooling elements via enlarged metallization regions and conductor-track cross-sections.

The carrier body or the cooling element, also referred to below as body, can preferably consist of at least one ceramic component or a composite of different ceramics. For example, technical aluminium oxide 80-99.9%, aluminium oxide, beryllium oxide, zirconium oxide, stabilized zirconium oxide, aluminium nitride, zirconium-reinforced aluminium oxide, glass ceramic or ceramics which have arisen owing to mixtures of at least two different ceramics or additives, could be mentioned. Monocrystalline ceramics may be, for example, sapphire.

The body may also consist of a composite material. Matrix materials, for example resins, polymers or silicones with aggregates may be used. The aggregates bring about a change in the thermal conductivity of the matrix materials. Multi-component systems may preferably be polymers with $Al_2O_3$, polymers with AlN, silicones with $Al_2O_3$/AlN.

The body may be rigid or flexible or a combination of rigid/flexible.

The body may be a metal/ceramic composite or a composite of ceramic and metal.

The body may be multilayered with inner conductor tracks and electrical component parts, such as resistors, coils, capacitors, etc., electrically conductive regions between the layers also being possible.

The body may also be used as a replacement for an electrically conductive cooling body, in this case in particular if the surrounding environment has a corrosive effect.

The body may at the same time also be a mounting housing.

The use of the carrier body according to the invention has the following advantages:
  reduction in the wide variety of components
  expansion of the wide variety of functions
  intrinsic protection against thermal overload
  long-term reliability
  avoidance of TCE mismatch owing to the use of a very wide variety of materials
  increase in power owing to improved heat dissipation
  overcoming the difficulty of directly dissipating high heat losses
  basic principle can be transferred to manifold applications
  a thermal balance which is system-inherent "per se"
  the detour of mounting the heat source in a separate housing, which in turn can be mounted on the body, is eliminated.

Heat sources may be electrical or electronic component parts, such as heating elements, Peltier elements, resistors, active and passive semiconductors, for example.

The heat can be produced intentionally as a function or can arise as a by-product when performing the function.

The heat sources can also experience changes in their functionality owing to the heat produced by them during operation.

The heat sources can be connected directly to the body, for example by a soldered joint.

IGBTs

Modules are subject to ever greater powers per unit area and the permanent functionality of these modules can only be ensured by cooling bodies being mounted.

Here, the carrier body according to the invention is selected for guiding heat away.

LEDs (Light-Emitting Diodes)

With the prior art it has not been possible to date, or only possible to a restricted extent, to satisfy greater demands in terms of luminance. The reasons for this are the poor thermal management associated with the prior art. As the luminance increases, the heat emitted increases. The heat emitted influences the life and the colour constancy significantly. The same also applies to applications with laser diodes.

According to the invention, the semiconductors can be mounted directly on a printed circuit board or housed in advance and then placed onto the printed circuit board as a component part. The circuit arranged on the printed circuit board in turn is cooled, according to the invention, by the cooling elements or the semiconductor is provided directly with an additional cooling body. Semiconductors may also be, for example, solar cells since their power output decreases with increasing temperature. In this case, the semiconductor itself would not produce any heat emission through the operation which would need to be dissipated, but in this case the semiconductor is heated by the IR component of the sunlight.

Controllers

The prior art, for example in motor cars, involves separating the heat sources from the circuit and electrically connecting them. In this case, too, the construction with thermally conductive cooling bodies is used.

Corrosion of Cooling Bodies

Under specific application conditions, surface corrosion results in the case of electrically conductive cooling bodies. The surface connections produced by chemical conversion change the transfer to the cooling medium and can also change the surface, for example by means of pitting. Carrier bodies consisting of a ceramic with integrated cooling elements alleviate this problem.

Ceramic Heating Element

Use for the thermal stabilization of the cooling body itself or of the direct or indirect environment.

Peltier Application

Peltier elements have a cold and a warm side. Depending on the application, the construction can always be seen in combination with a separate cooling body. Here, the Peltier element can be applied directly to the electrically insulating cooling body.

Within the sensor system/on the surface of the sensor system owing to direct feedback in the dedicated system The cooling body itself can contain a sensor system which has been introduced or mounted/applied to a surface. Owing to the direct coupling to the system, self-regulating protective functions of the heat sources are possible.

Mounting of the Cooling Body
  Mounting points, pads, cavities, mounting bolts
Active and Passive Cooling
  drilled holes
  fans
  ribs in cooling medium other than air When mounting the component part and the cooling body, the prior art often also requires a third component, a so-called heat-conducting film, which needs to at the same time also be electrically insulating. In order that the desired effect of the heat dissipation can be achieved, the cooling body and the component part need to have flat and planar-parallel surfaces, in order that a 100% interlocking connection is ensured. If another heat-conducting film is used, this also needs to have a flat and planar-parallel surface. When mounting such a construction, a screw connection is often selected. If, during mounting or during operation, there are delays in the construction, the thermal contact may be partially lost. The functionality and life of the construction are therefore brought into question.

According to the invention, there is now for the first time the possibility of a soldered joint on the electrically insulating cooling bodies, the above-mentioned disadvantages of the thermal coupling not arising during the soldering process.

Multilayer Sandwich Construction

Simple mechanical connections of the cooling body for mounting the unit itself or for connecting further cooling bodies and/or functions associated with the body.

Self-Cooled Printed Circuit Board

The prior art is to provide a printed circuit board with insufficient thermal management with an electrically conductive cooling body. In this case, the thermal coupling is set boundaries in so far as it needs to be stable for a long period of time. Limiting factors are, for example, the geometric change over time of the electrically insulating medium.

FIGS. 1 to 20 show embodiments of the carrier body 1 according to the invention.

FIG. 1 shows, by way of example, a carrier body 1 consisting of a ceramic with cooling elements 7 of ceramic which are formed integrally as ribs. A further independent carrier body 2 is located on the carrier body 1. The carrier bodies 1 and 2 each bear metal-containing, i.e. electrically conductive, layers 9. The connection between the carrier body 2 and the carrier body 1 can be represented by means of a soldered joint 14. Heat can therefore be removed from the carrier body 2, or the carrier body 2 can be cooled, via the carrier body 1 to the cooling elements 7. An LED 6c can be fitted to the carrier body 2 by the base plate 5 of the LED 6c being connected to the metal-containing layer 9 of the carrier body 2 via a soldered joint 14. The cooling elements 7 are connected integrally to the carrier body 1 by means of sintering. The cooling elements 7 themselves can also act as carrier bodies. The combination of more than two carrier bodies is also advantageous.

Figure 2:
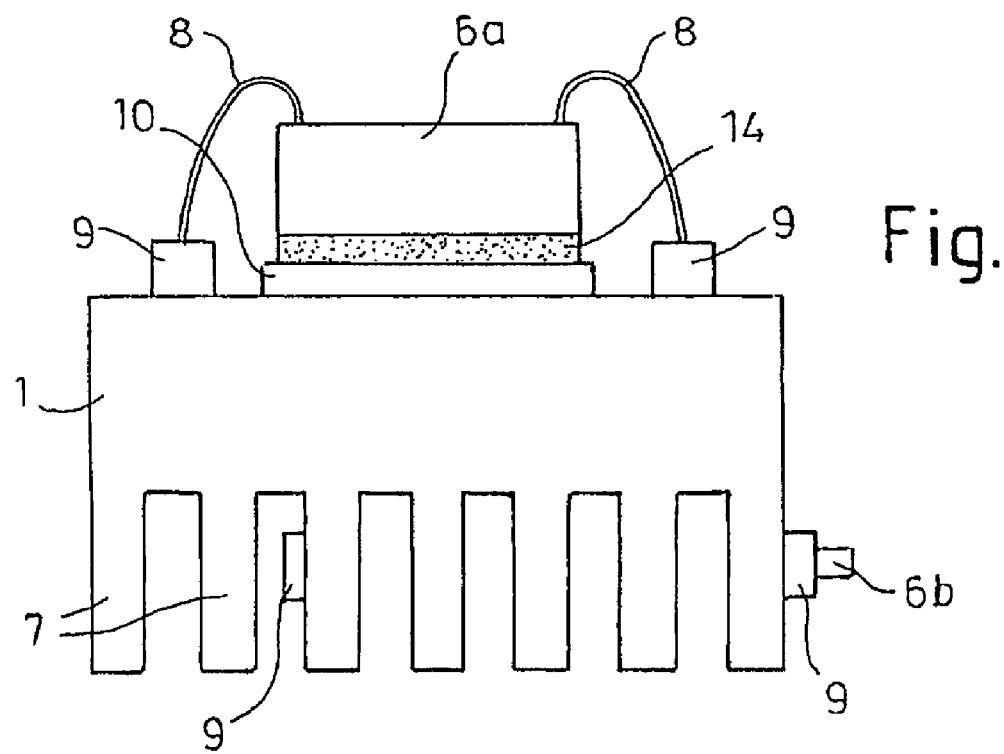
FIG. 2 shows an embodiment of the carrier body according to the invention having a chip connected to electrically conducted layers by leads.

FIG. 2 shows a carrier body 1 consisting of a ceramic with cooling elements 7 of ceramic formed integrally as ribs. A chip 6a, which is representative of any desired heat source, is located on this carrier body 1. This chip 6a is connected to electrically conductive layers 9 via leads 8. The chip 6a can be connected directly to the carrier body 1 or can be connected to the soldered joint 14, for example, via a metal layer 10 which can be soldered, on said metal layer. A further electrical or electronic component element is denoted by the reference symbol 6b, this component element representing a heat source, as does the chip 6a. The component part 6b is arranged on the cooling element 7 on an electrically conductive layer 9. The cooling element 7 therefore in this case also takes on the function of a carrier body. The cooling elements 7 are integrally connected to the carrier body 1 by means of sintering. The other cooling elements 7 can also act as carrier bodies.

Figure 3:
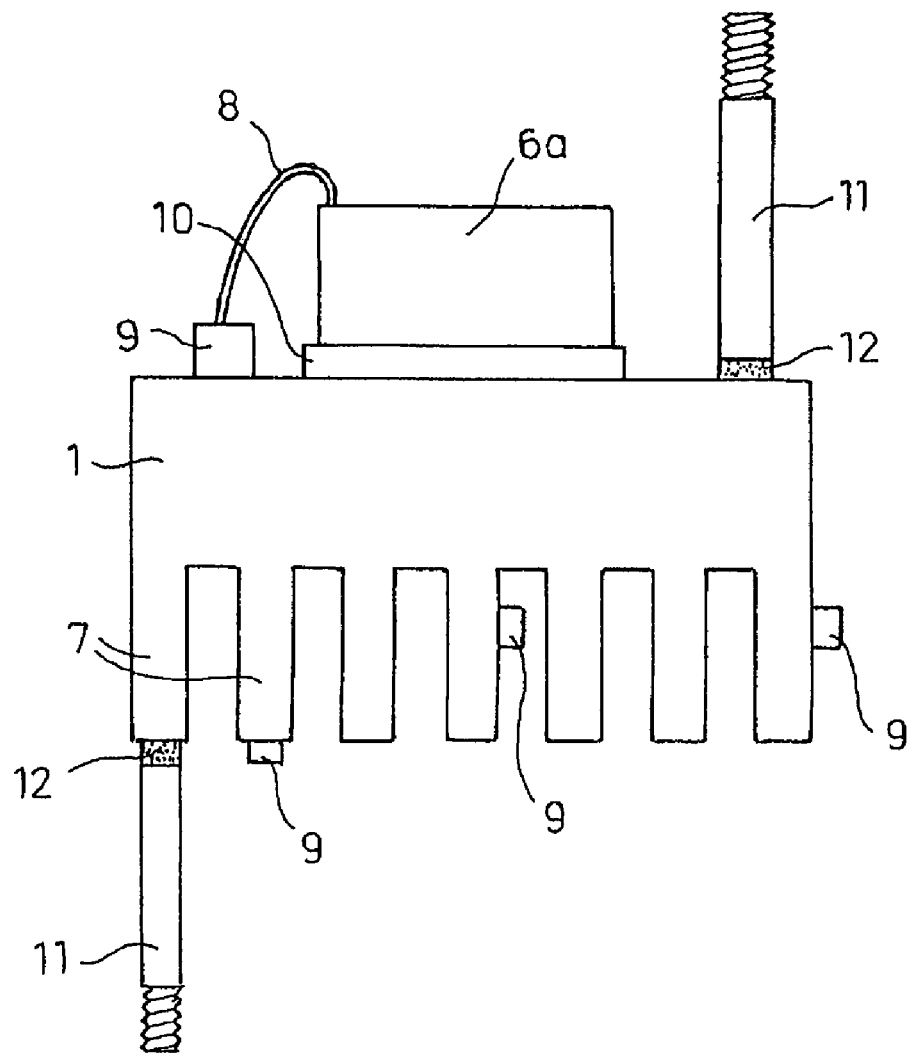
FIG. 3 shows the possibility of connecting the carrier body and/or the cooling elements to further components.

FIG. 3 shows, by way of example, the possibility of connecting the carrier body 1 and/or the cooling elements 7 to further components, for example a further carrier body or a superordinate component element, via a mounting possibility, for example a screw connection 11, via an adhesive compound 12 or similar fixing options. The screw connection 11 therefore represents a mounting option. Otherwise, the carrier body 1 is virtually identical to that shown in FIG. 2.

Figure 4:
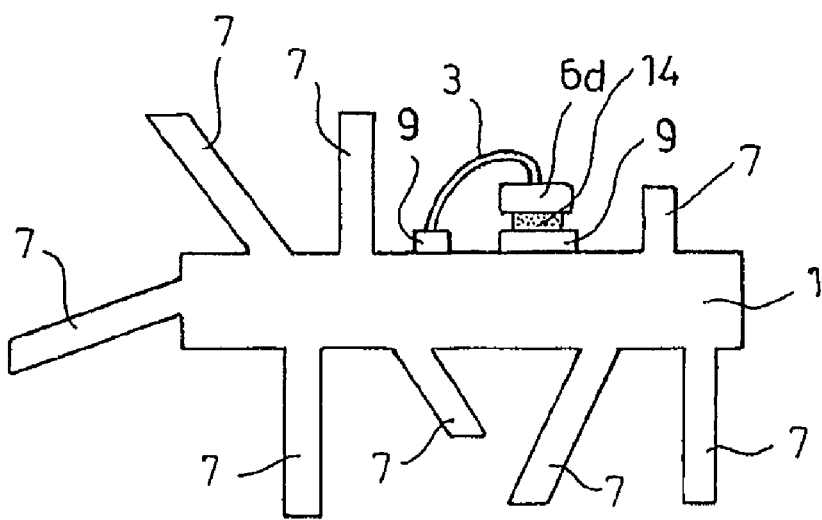
FIG. 4 shows, by way of example, the options for arranging identical or differently shaped cooling elements on the carrier body 1.

FIG. 4 shows, by way of example, the options for arranging identical or differently shaped cooling elements 7 on the carrier body 1. The cooling elements 7 can point in all physical directions in terms of their orientation with respect to the surface of the carrier body 1 as desired, in the same way or in combinations thereof. Here, a semiconductor 6d is connected to the carrier body 1 with a layer of solder 14 via a metal-containing electrically conductive layer 9. The semiconductor 6d is also connected to the metal-containing layer 9 with a wire 3.

FIGS. 5a-5d show different possibilities as to how surface modifications may appear. FIG. 5a shows a surface modification by introducing cavities or holes 4 into the cooling elements 7.

FIG. 5b shows a surface modification by introducing angular furrows 13 and/or a simultaneous thickness profile for the cooling element 7.

FIG. 5c shows a surface modification by introducing corrugated furrows 15 into the cooling elements 7.

FIG. 5d shows a surface modification by branch-like bifurcations 16 in the cooling element 7.

Figure 6:
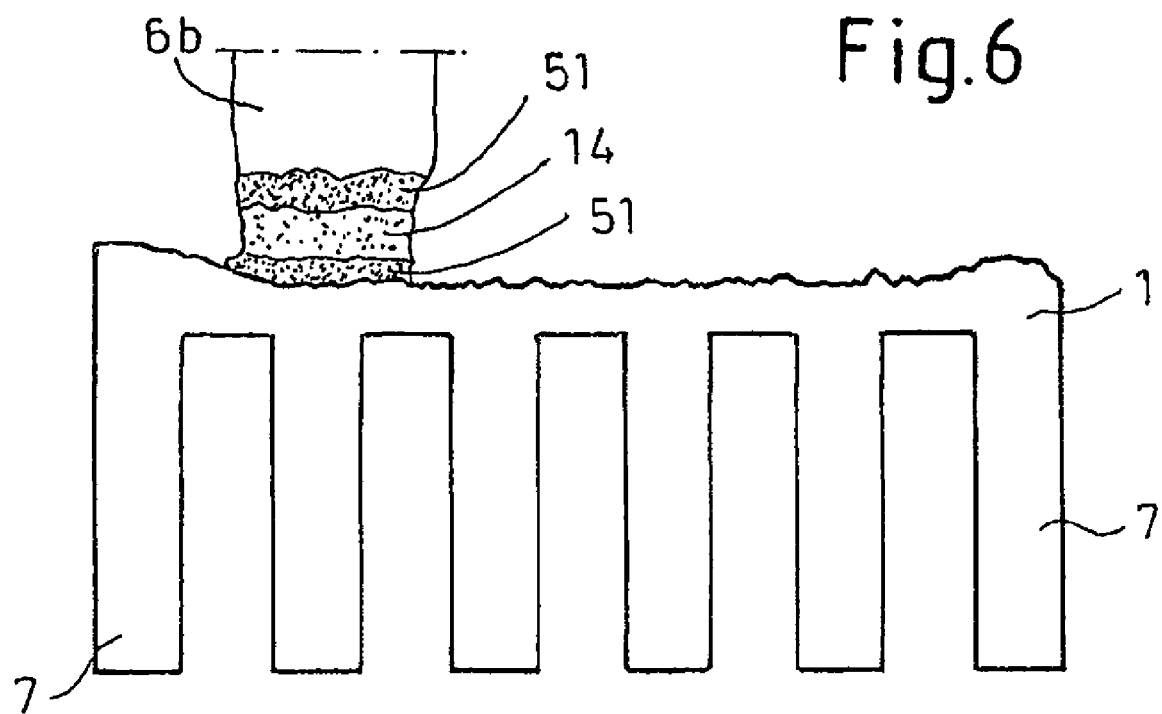
FIG. 6 shows an unevenly shaped rough surface of a carrier body, which is connected to a component part.

FIG. 6 shows an unevenly shaped rough surface of a carrier body 1, which is connected to a component part 6b. The component part 6b and the carrier body 1 are provided with a metallization layer 51 which can be soldered. The complete interlocking connection is produced via a soldered joint 14.

Figure 7:
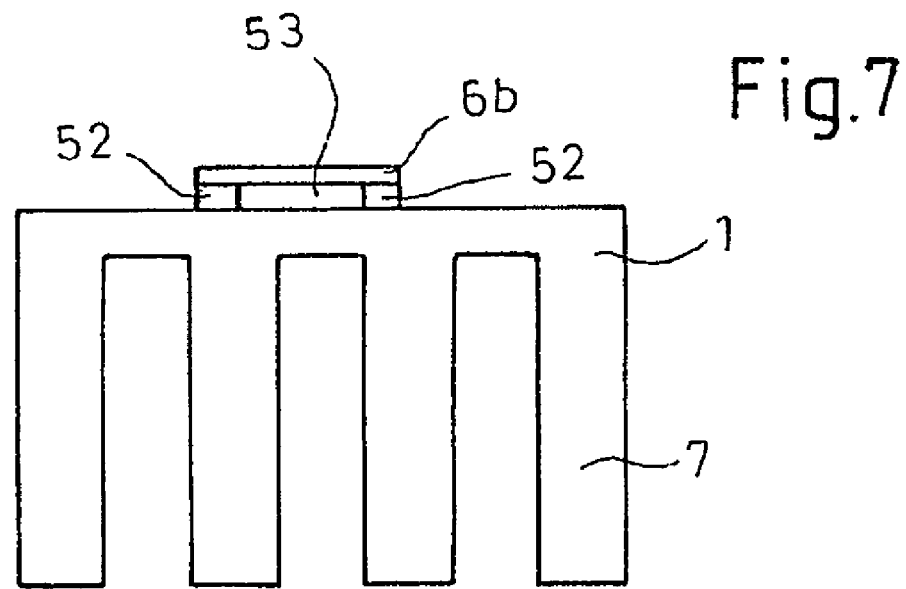
FIG. 7 shows a carrier body on which a component element is arranged via a partially interlocking connection.

FIG. 7 shows a carrier body 1 on which a component element 6b is arranged via a partially interlocking connection 52. Regions 53 without an interlocking connection are arranged between the interlocking connection 52.

Figure 8:
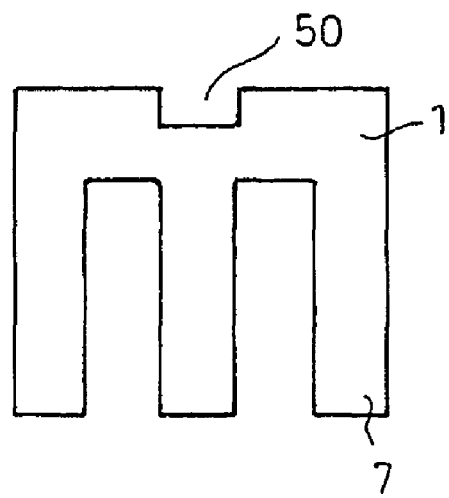
FIG. 8 shows a cutout in the carrier body.

FIG. 8 shows a cutout 50 in the carrier body 1, and

Figure 9:
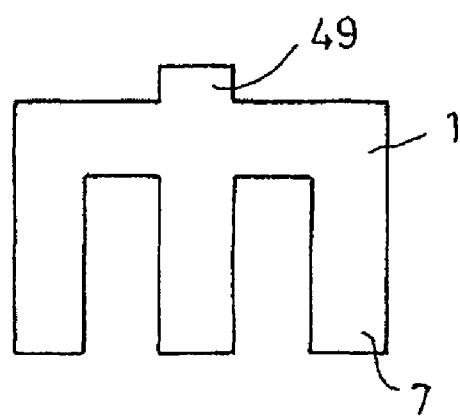
FIG. 9 shows an elevation on a carrier body.

FIG. 9 shows an elevation 49 on a carrier body 1.

Figure 10:
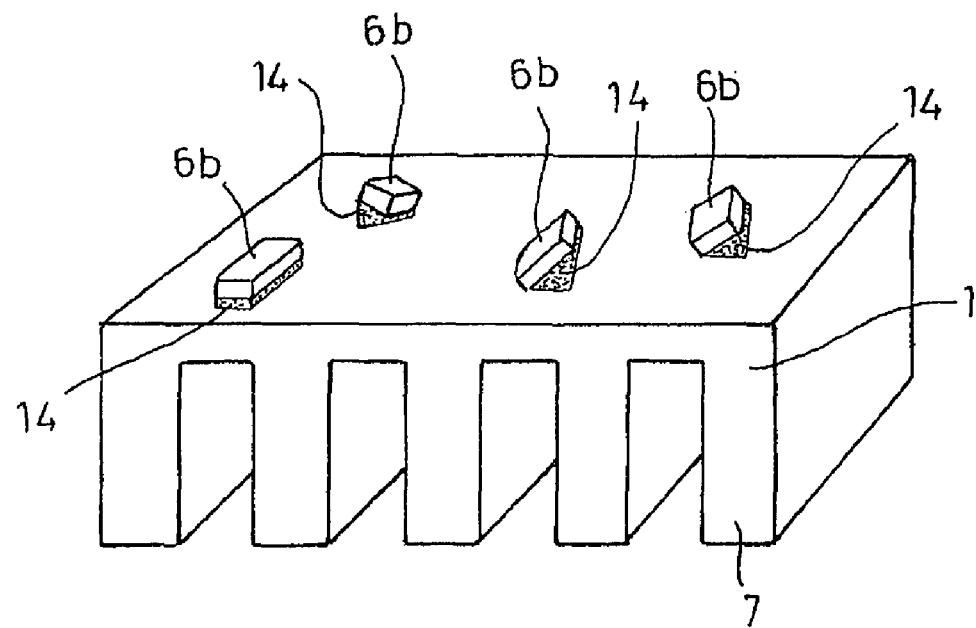
FIG. 10 shows a carrier body with cooling elements having component elements are arranged, in different physical arrangements, via a soldered joint.

FIG. 10 shows a carrier body 1 with cooling elements 7. Component elements 6b are arranged, in different physical arrangements, via a soldered joint 14 on the carrier body 1. For example, the component elements 6b could be LEDs, which are intended to radiate in different directions.

Figure 11:
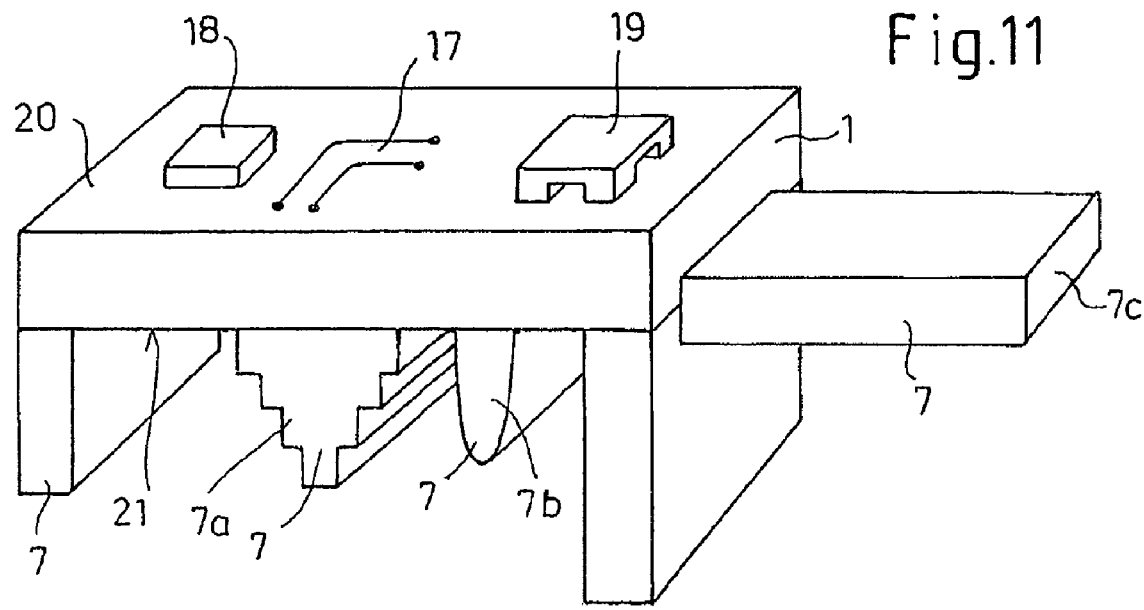
FIG. 11 shows a carrier body with integrally connected cooling elements, wherein the carrier body and the cooling elements consist of a ceramic material and are both integrally connected to one another by a sintering process.

FIG. 11 shows a carrier body 1 with integrally connected cooling elements 7. The carrier body 1 and the cooling elements 7 consist of a ceramic material and are both integrally connected to one another by a sintering process, i.e. they are a single component part. A cooling element 7a is stepped in cross-section, another cooling element 7b is pin-shaped in cross-section, and another cooling element 7c is parallelepipedal. The cooling elements 7a and 7b are arranged on the lower side 21 of the carrier body 1. A cooling element 7c is arranged laterally on the carrier body 1 and cooling element 7.

Conductor tracks 17 are arranged on the upper side 20 of the carrier body 1. That side of the carrier body 1 which faces away from the upper side 20 is identified as the lower side 21. In addition to the conductor tracks 17, only illustrated schematically here, copper 18, as a metal, is applied to the entire area on the upper side 20 of the carrier body 1 using the DCB process. In addition, a metal 19 is also applied to part of the area. Preferably, the thermal conductivity of the metal 19 is approximately equal to the thermal conductivity of the carrier body 1 and/or the cooling elements 7. Thermal conductivity is understood as the ratio of watts/mK. The thermal conductivity of the metal 19 can naturally also not be equal to the thermal conductivity of the carrier body 1 and/or the cooling elements 7.

Figure 12:
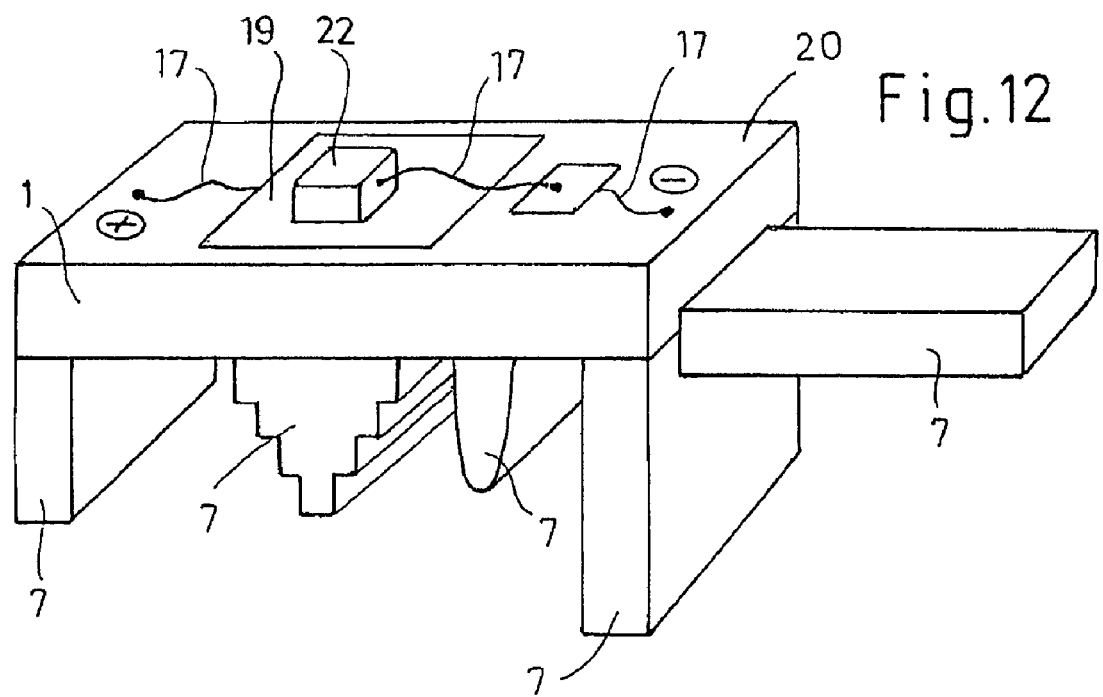
FIG. 12 shows a carrier body with cooling elements having a heat source arranged on the upper side 20 on a metal 19.

FIG. 12 shows a carrier body 1 with cooling elements 7, as is also shown in FIG. 11. A heat source 22 is arranged on the upper side 20 on a metal 19. The heat source 22 is driven via conductor tracks 17. The conductor tracks 17 have the function of electrical conductivity, and the metal 19 has the function of thermal spreading and electrical conductivity.

Figure 13:
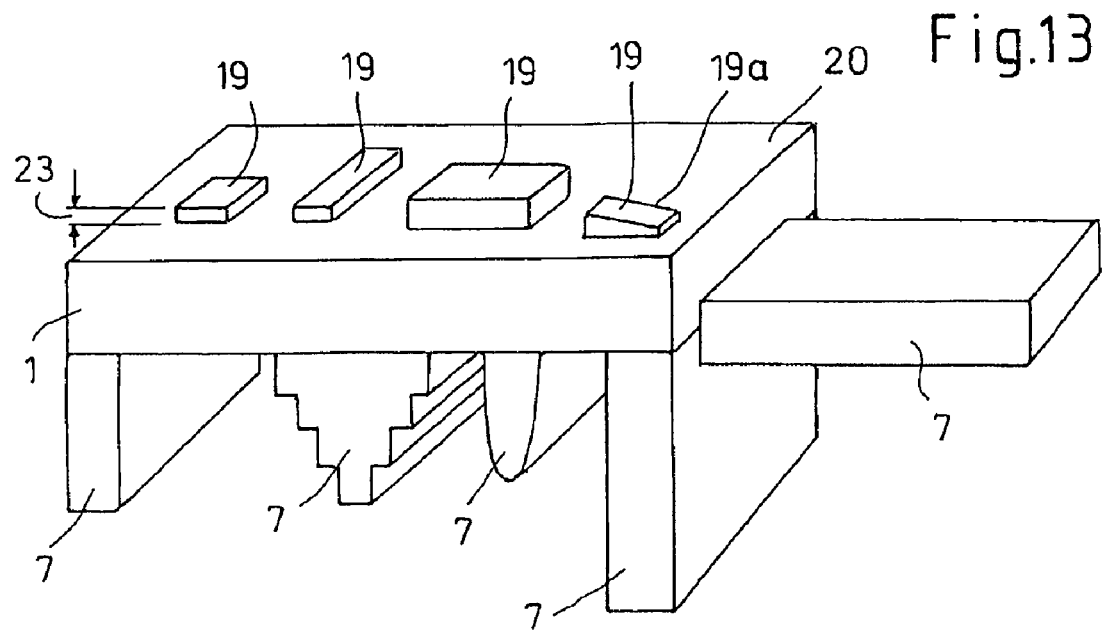
FIG. 13 shows a carrier body with cooling elements wherein metals, which differ in terms of their thickness, i.e. height, are arranged on the upper side of the carrier body.

FIG. 13 shows a carrier body 1 with cooling elements 7, as is also shown in FIGS. 11 and 12. Metals 19, which differ in terms of their thickness 23, i.e. height, are arranged on the upper side 20 of the carrier body 1. The metal 19a has a thickness gradient, i.e. the thickness always increases continuously from one side to the other side. The metals 19 may be connected to the carrier body 1 over the entire area or over part of the area.

Figure 14:
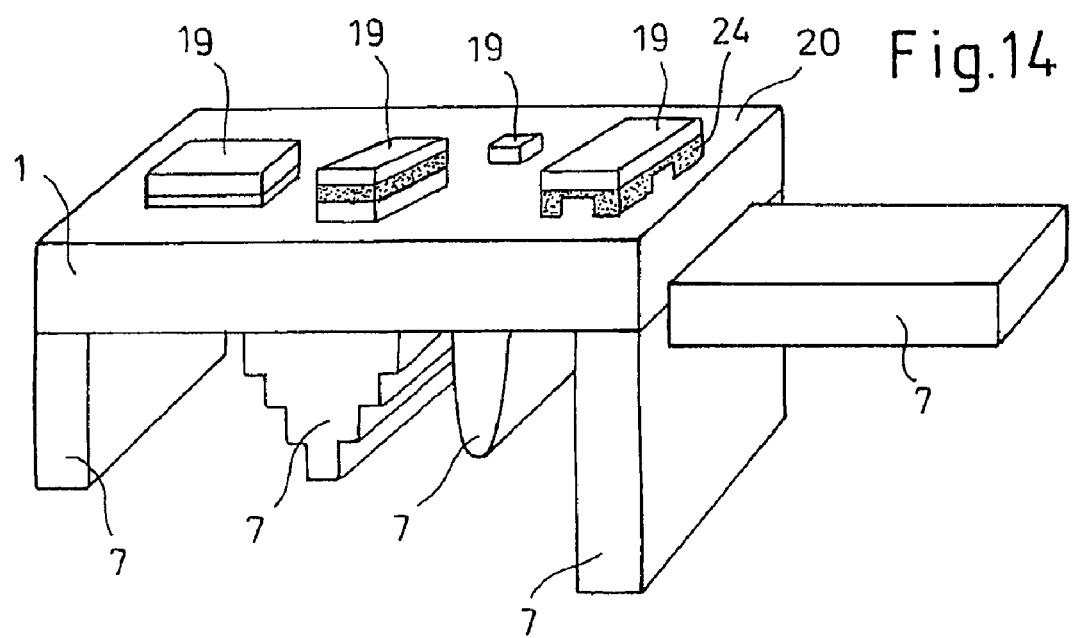
FIG. 14 shows a carrier body with cooling elements, having metals arranged in a plurality of layers on the upper side

FIG. 14 shows a carrier body 1 with cooling elements 7, as is also shown in FIGS. 11 to 13. Metals 19 are arranged in a plurality of layers on the upper side 20. Both a plurality of layers of a single metal and a plurality of layers of different metals can be applied. Individual layers can also have a structure 24.

FIG. 15a shows a carrier body 1 with cooling elements 7, as is shown in FIGS. 11 to 13. The carrier body 1 may have been completely penetrated by colour (see region 48) or it is also possible for only individual regions of the carrier body 1 to be coloured. FIG. 15b shows a detail of the carrier body 1 or cooling element 7 along a broken edge x. A uniform penetration of colour can be seen.

FIG. 15c shows a coloration which has the form of a gradient. After production of the carrier body 1 with the cooling bodies 7, a colour-imparting additive is applied which colours the bulk material after a thermal treatment.

FIG. 15d shows a detail of the cooling body 7 in which the bulk material has not been coloured. For this purpose, a surface coating is applied, for example a varnish. The broken edge is identified by the reference symbol x in all figures.

Figure 16A:
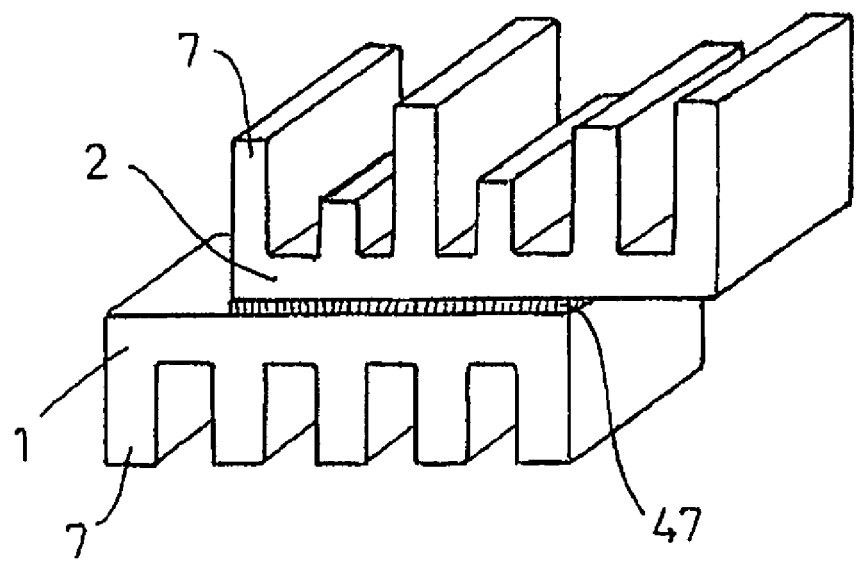
FIGS. 16a and 16b show a carrier body 1 is connected to another carrier body 2, wherein the connecting materials are characterized by the reference symbol 47. The cooling elements 7 in FIGS. 16a, b are ribs of a very wide variety of types.
Figure 16B:
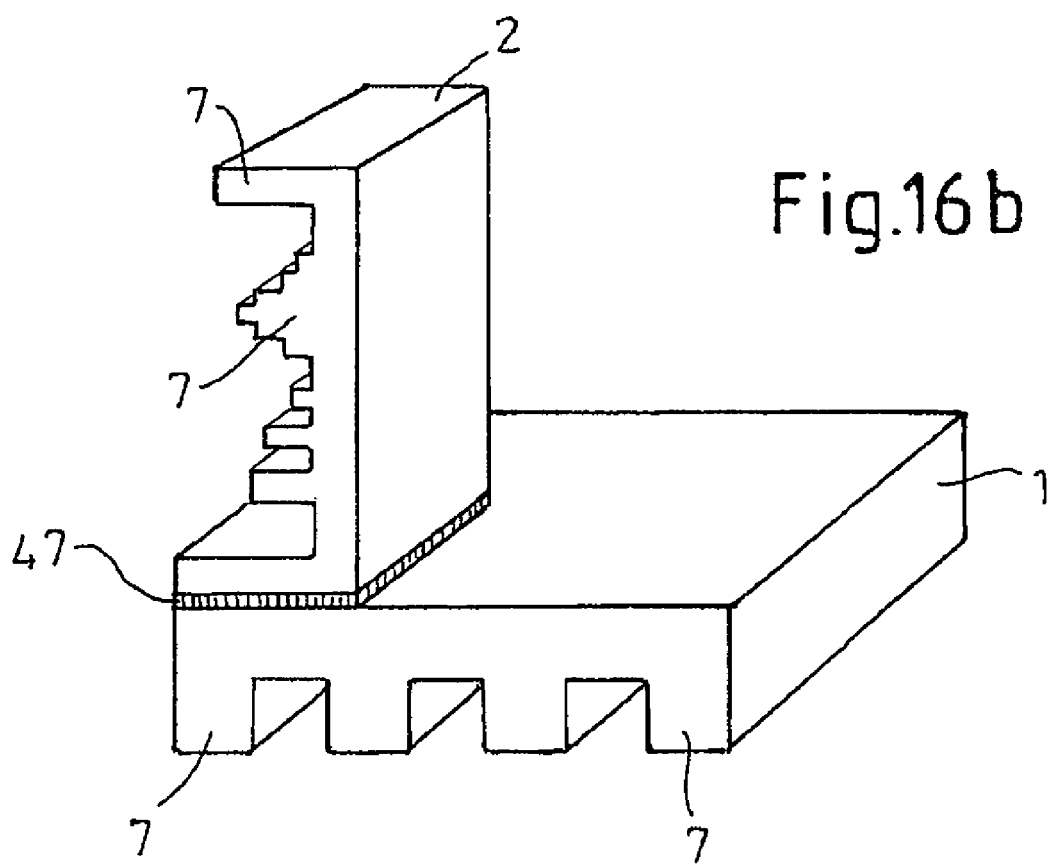

In FIGS. 16a and 16b, a carrier body 1 is connected to another carrier body 2. The connection may be of a wide variety of types and depends on the requirements. The connecting materials are characterized by the reference symbol 47. The cooling elements 7 in FIGS. 16a, b are ribs of a very wide variety of types.

Figure 17:
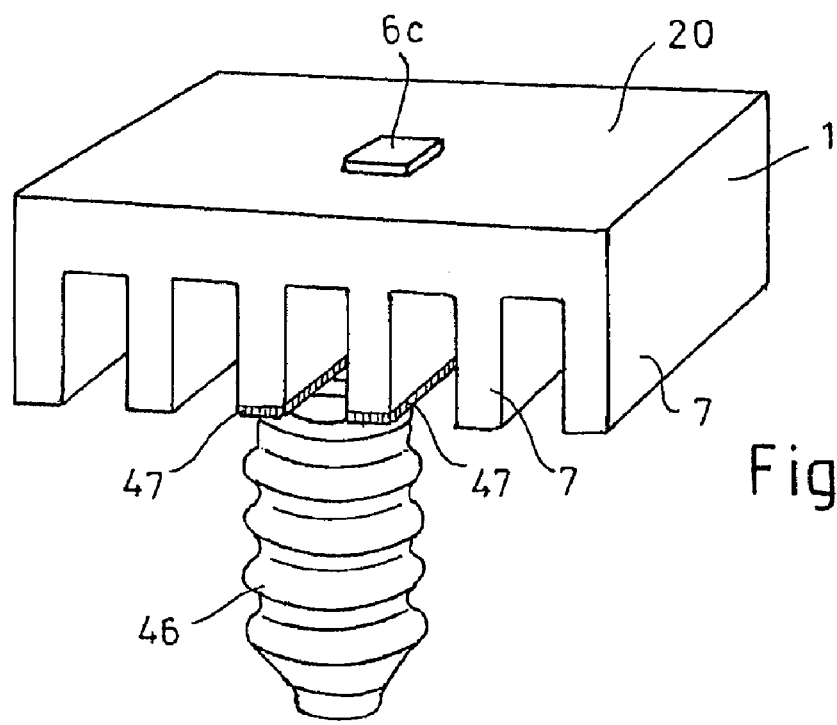
FIG. 17 shows a carrier body with cooling elements, with a base arranged on the cooling elements via connecting materials.

FIG. 17 shows a carrier body 1 with cooling elements 7, a base E27 46 being arranged on the cooling elements 7 via connecting materials 47. This base E27 46 is used for accommodating a lighting means, for example an incandescent lamp. The base E27 46 is also generally used here for all electrical connectors, plugs or sockets. An LED 6c is arranged on the upper side 20.

Figure 18:
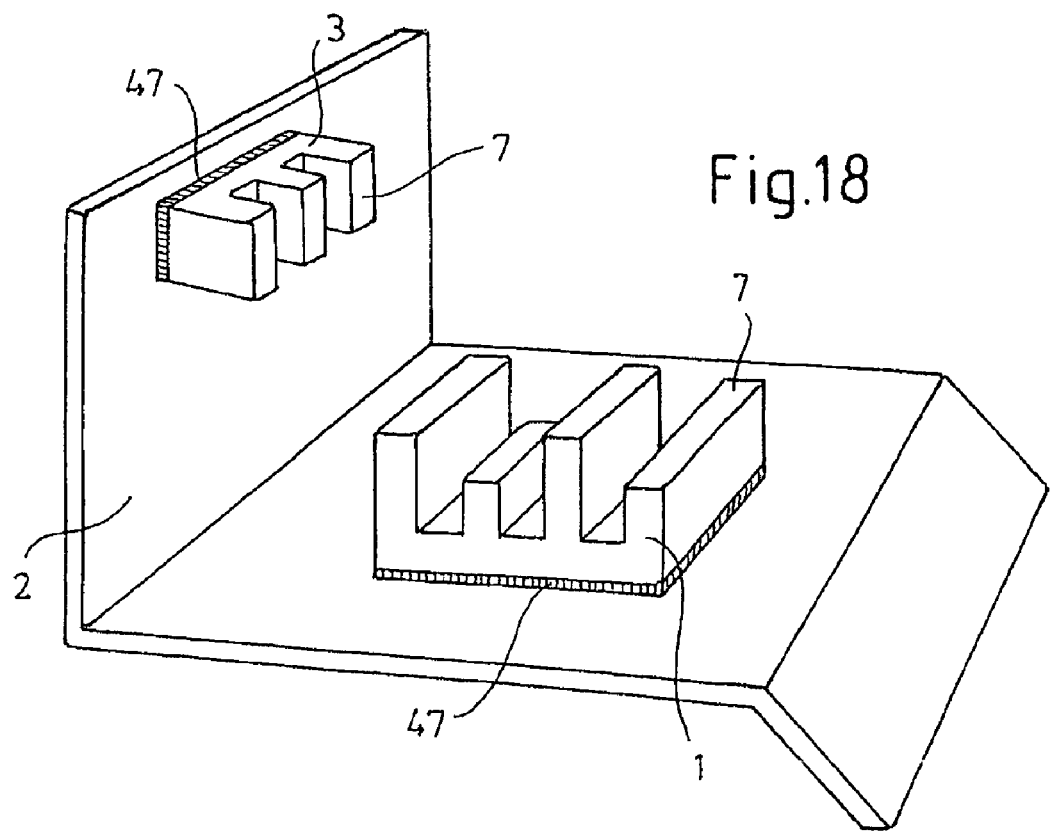
FIG. 18 shows an embodiment according to the invention in which a carrier body 1 is connected to another carrier body 2 to form a three-dimensional construction.

FIG. 18 shows an embodiment according to the invention in which a carrier body 1 is connected to another carrier body 2 to form a three-dimensional construction (array). 47 again identifies the connecting material. A further carrier body 3 is arranged on the other carrier body 2.

The carrier body 2 is in the form of a three-dimensional geometric body.

FIGS. 19a, b, c show a carrier body 1, which is integrally connected to cooling elements 7. The entire surface of the carrier body 1 is in the form of a sintered metallization region 41. The metallization region 41 consists of tungsten and is chemically nickel-plated. FIG. 19a shows the carrier body 1 with the cooling elements 7 in a three-dimensional view, and FIG. 19b shows a plan view, from below, of the cooling elements 7. FIG. 19c shows a cross-section along the line A-A in FIG. 19b.

The carrier body 1 with the cooling elements 7 has a length L of 50 mm and a width B of 25 mm. The height H1 of the cooling elements 7 is 10 mm, and the height H2 of the entire carrier body 1 with the cooling elements 7 is 13 mm. The individual cooling elements 7 have a thickness D of 2 mm, and the distance A between the cooling elements 7 is 2 mm. The individual cooling elements 7 are slightly rounded at their ends.

FIGS. 20a, b, c, d show a carrier body 1 with cooling elements 7, which is identical in terms of its dimensions to the carrier body 1 in FIG. 19. Here, however, not the entire surface of the carrier body 1 is in the form of a sintered metallization region, but only individual circular metallization regions 41 are arranged which consist of tungsten and are chemically nickel-plated. The tungsten layer has a thickness of at least 6 μm and the nickel layer has a thickness of at least 2 μm. The individual metallization regions 41 have a diameter of 5 mm. This carrier body 1 is used, for example, for accommodating LEDs.

The invention claimed is:

1. A carrier body for electrical or electronic component elements or circuits, the carrier body being electrically nonconductive or virtually nonconductive, and the carrier body being provided integrally with heat-dissipating or heat-supplying cooling elements, wherein the carrier body is a printed circuit board, the carrier body and the cooling element comprise a ceramic or a composite material, and the composite material contains electrically nonconductive or virtually nonconductive matrix materials with heat-conducting aggregates, and sintered metallization regions are applied to the surface of the carrier body.

2. A carrier body according to claim 1, wherein at least one mounting option is connected to the carrier body or cooling element.

3. A carrier body according to claim 1, wherein the cooling element bears a desired surface structuring which result in the effect of altering the surface.

4. A carrier body according to claim 1, wherein the carrier body is connected to metal layers >5 μm thick.

5. A carrier body according to claim 1, wherein the carrier body is used as a heat source wherein the heat produced is provided to a medium having a temperature, and wherein the whose temperature is regulated via the carrier body or the cooling element.

6. A carrier body according to claim 1, wherein one or more light-emitting substances or one or more light-emitting components or a combination thereof are connected to the carrier body.

7. A carrier body according to claim 1, wherein the carrier body is connected to at least one further geometrically identical or different carrier body via connecting materials to form a type of three-dimensional array.

8. A carrier body according to claim 1, wherein the carrier body is connected to one or more light-emitting substances or one or more light-emitting components and combinations thereof and is also provided with standardized or nonstandardized electrical connectors.

9. A carrier body according to claim 8, wherein the electrical connectors are lamp bases.

10. A carrier body according to claim 1, wherein at least one different or identical carrier body are embedded in a matrix material with a desired orientation.

11. A carrier body according to claim 1, wherein, in a carrier body, a change in heat transport is achieved by modifying the size or the coloring or the metallized regions or the geometry or changing in cooling elements or number of cooling elements or a combination thereof.

12. A carrier body according to claim 1, wherein the carrier body does not have any screening effect or has little screening effect with respect to electrical or magnetic or electromagnetic fields or combinations of these, and therefore these fields can also pass through the carrier body.

13. A carrier body for electrical or electronic component elements or circuits, the carrier body being electrically nonconductive or virtually nonconductive, and the carrier body being provided integrally with heat-dissipating or heat-supplying cooling elements, wherein the carrier body is a printed circuit board, the carrier body and the cooling element comprise a ceramic or a composite material, and the composite material contains electrically nonconductive or virtually nonconductive matrix materials with heat-conducting aggregates, and sintered metallization regions are applied to the surface of the carrier body, wherein the sintered metallization regions consist of tungsten and are chemically nickel-plated.

14. A carrier body for electrical or electronic component elements or circuits, the carrier body being electrically nonconductive or virtually nonconductive, and the carrier body being provided integrally with heat-dissipating or heat-supplying cooling elements, wherein the carrier body is a printed circuit board, the carrier body and the cooling element comprise a ceramic or a composite material, and the composite material contains electrically nonconductive or virtually nonconductive matrix materials with heat-conducting aggregates, and a plurality of circular sintered metallization regions are applied to the surface of the carrier body, wherein the sintered metallization regions consist of tungsten and are chemically nickel-plated.

\* \* \* \* \*